(12) United States Patent
Eldridge

(10) Patent No.: US 6,794,261 B2
(45) Date of Patent: Sep. 21, 2004

(54) METHODS OF FORMING VOID REGIONS, DIELECTRIC REGIONS AND CAPACITOR CONSTRUCTIONS

(75) Inventor: Jerome Michael Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 62 days.

(21) Appl. No.: 10/044,206

(22) Filed: Jan. 11, 2002

(65) Prior Publication Data

US 2002/0068430 A1 Jun. 6, 2002

Related U.S. Application Data

(62) Division of application No. 09/651,815, filed on Aug. 30, 2000, which is a continuation of application No. 09/146,117, filed on Sep. 2, 1998, now Pat. No. 6,140,200.

(51) Int. Cl.⁷ .............................................. H01L 21/20
(52) U.S. Cl. ........................ 438/396; 438/424; 438/697
(58) Field of Search ................................. 438/396–424, 438/697, 231, 552, 230, 948, 949, 950, 660, 532, 522, 305, 303, 695–700

(56) References Cited

U.S. PATENT DOCUMENTS

| | | |
|---|---|---|
| 3,954,523 A | 5/1976 | Magdo et al. |
| 5,023,200 A | 6/1991 | Blewer et al. |
| 5,273,616 A | 12/1993 | Bozler ........................ 156/603 |
| 5,470,801 A | 11/1995 | Kapoor et al. |
| 5,707,896 A * | 1/1998 | Chiang et al. .............. 438/231 |
| 5,731,241 A | 3/1998 | Jang et al. |
| 5,753,548 A * | 5/1998 | Yu et al. ..................... 438/231 |
| 5,783,253 A | 7/1998 | Roh |
| 5,885,900 A | 3/1999 | Schwartz |
| 5,989,776 A | 11/1999 | Felter et al. ................ 430/270 |
| 6,140,200 A * | 10/2000 | Eldridge ..................... 438/396 |

OTHER PUBLICATIONS

Togo, M., "A Gate–side Air–gap Structure (GAS) to Reduce the Parasitic Capacitance in MOSFETs", 1996 Sympos. on VLSI Technology Digest of Technical Papers, IEEE 1996, pp. 38–39.

Anand, M.B., "NURA: A Feasible, Gas–Dielectric Interconnect Process", 1996 Symposium on VLSI Technology Digest of Technical Papers, IEEE 1996, pp. 82–83.

(List continued on next page.)

*Primary Examiner*—Carl Whitehead, Jr.
*Assistant Examiner*—Laura M Schillinger
(74) *Attorney, Agent, or Firm*—Well St. John P.S.

(57) ABSTRACT

In one aspect, the invention includes a method of forming a void region associated with a substrate, comprising: a) providing a substrate; b) forming a sacrificial mass over the substrate; c) subjecting the mass to hydrogen to convert a component of the mass to a volatile form; and d) volatilizing the volatile form of the component from the mass to leave a void region associated with the substrate. In another aspect, the invention includes a method of forming a capacitor construction, comprising: a) forming a first capacitor electrode over a substrate; b) forming a sacrificial material proximate the first capacitor electrode; c) forming a second capacitor electrode proximate the sacrificial material, the second capacitor electrode being separated from the first capacitor electrode by the sacrificial material, at least one of the first and second electrodes being a metal-comprising layer; and d) subjecting the sacrificial material to conditions which transport a component from the sacrificial material to the metal-comprising layer, the transported component leaving a void region between the first and second capacitor electrodes.

12 Claims, 4 Drawing Sheets

OTHER PUBLICATIONS

Watanabe, H., "A Novel Stacked Capacitor with Porous–Si Electrodes for High Density DRAMs", Microelectronics Research Laboratories, NEC Corp., date unknown, pp. 17–18.

Abstract: Anderson, R.C. et al., "Porous Polycrystalline Silicon: A New Material For MEMS", Jnl. of Microelectromechanical Systems (Mar. 1994), vol. 3, No. 1, pp. 10–18.

M. B. Anand, "Use of Gas as Low–k Interlayer Dielectric in LSI's: Demonstration of Feasibility", IEEE Transactions On Electron Devices, vol. 44, No. 11, Nov. 1997, pp. 1965–1971.

U.S. patent application Ser. No. 08/947,847, Juengling et al., filed Oct. 9, 1997.

* cited by examiner

US 6,794,261 B2

METHODS OF FORMING VOID REGIONS, DIELECTRIC REGIONS AND CAPACITOR CONSTRUCTIONS

CROSS REFERENCE TO RELATED APPLICATION

This patent resulted from a divisional application of U.S. pant application Ser. No. 09/651,815, filed Aug. 30, 2000, entitled "Methods of Forming Void Regions, Dielectric Regions and Capacitor Constructions," naming Jerome Michael Eldridge as inventor, which is a continuation of U.S. patent application Ser. No. 09/146,117, filed Sep. 2, 1998, now U.S. Pat. No. 6,140,200, the disclosures of which are incorporated by reference.

TECHNICAL FIELD

The invention pertains to methods of forming insulative regions and void spaces. In one aspect, the invention pertains to methods of forming insulative regions associated with semiconductive substrates. In another aspect, the invention pertains to methods of forming insulative dielectric regions for capacitor constructions.

BACKGROUND OF THE INVENTION

Insulative regions are commonly utilized in circuitry constructions to electrically isolate conductive components. For instance, an insulative dielectric layer can be provided between capacitor electrodes to form a capacitor construction. As another example, an insulative material can be provided between conductive lines to electrically isolate the lines from one another. The insulative materials can comprise, for example, silicon dioxide, silicon nitride, aluminum oxide and undoped silicon. Although each of these materials has good insulative properties, the materials also have high dielectric constants which can lead to capacitive coupling between proximate conductive elements. For instance, silicon dioxide has a dielectric constant of about 4, silicon nitride has a dielectric constant of about 8, and undoped silicon has a dielectric constant of about 12.

A void region or space between two conducting materials also serves as a dielectric and offers the lowest possible dielectric constant, having a value equal to 1. It is noted that a void space can comprise a vacuum, but typically comprises some gases. A void space can alternatively be referred to as a free space. Regardless of whether the term "void space" or "free space" is utilized herein, such refers to a space that is empty of materials in a solid or liquid phase. It would be desirable to develop methods of utilizing void regions as insulators in semiconductor constructions.

In another aspect of the prior art, small, precisely configured void regions can be formed by micro-machine technology. Such void regions can have a number of applications, including, for example, utilization as microfluidic flow columns for gas chromatography. It would be desirable to develop alternative methods of forming small, precisely configured void regions.

SUMMARY OF THE INVENTION

In one aspect, the invention encompasses a method of forming a void region associated with a substrate. A substrate is provided and a sacrificial mass is formed over the substrate. The mass is subjected to hydrogen to convert a component of the mass to a volatile form. The volatile form of the component is volatilized from the mass to leave a void region associated with the substrate.

In another aspect, the invention encompasses a method of forming a capacitor construction. A first capacitor electrode is formed over a substrate, a sacrificial material is formed proximate the first capacitor electrode, and second capacitor electrode is formed proximate the sacrificial material. The second capacitor electrode is separated from the first capacitor electrode by the sacrificial material. At least one of the first and second electrodes is a metal-comprising layer having certain selected properties. The sacrificial material is subjected to conditions which transport a component from the sacrificial material to the metal-comprising layer. The transported component leaves a void region between the first and second capacitor electrodes.

In yet another aspect, the invention encompasses a void forming method. A first material, a second material, and a sacrificial mass are provided, with the sacrificial mass being between the first and second materials. Selected portions of the sacrificial mass are exposed to conditions which hydrogenate said selected portions. The exposing volatilizes the selected portions to form at least one void within the sacrificial mass and between the first and second materials.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
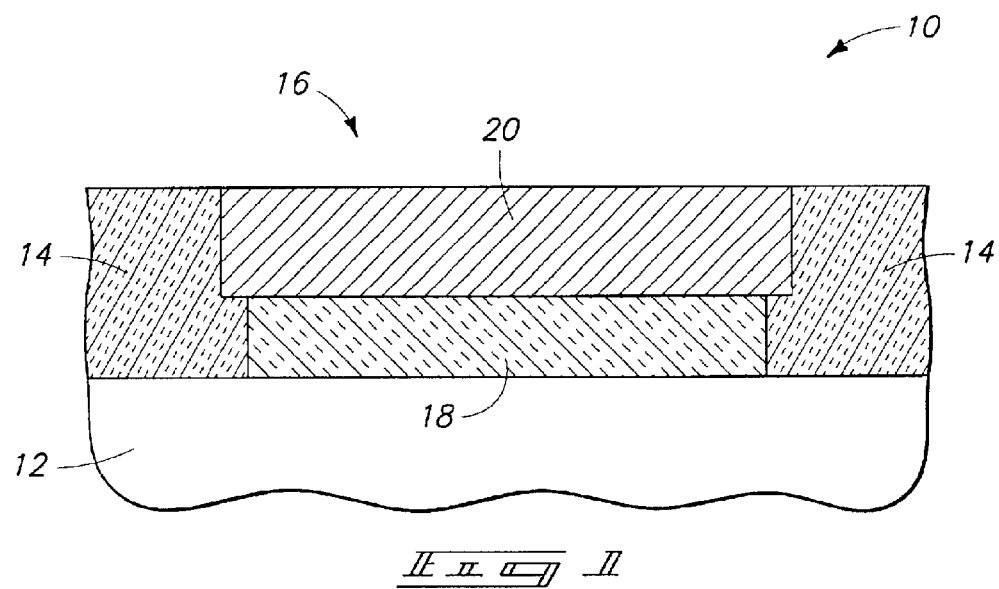
FIG. 1 is a diagrammatic, cross-sectional, fragmentary view of a semiconductor wafer fragment at a preliminary stage of a method of the present invention.

In one aspect, the present invention encompasses methods wherein at least a portion of a sacrificial mass is volatilized to leave a void region. Such aspect is described with reference to FIGS. 1 and 2. Referring to FIG. 1, a semiconductor wafer fragment 10 is illustrated at a preliminary stage of the invention. Semiconductor wafer fragment 10 comprises a substrate 12 and a supporting material 14 formed over substrate 12. Support material 14 can comprise, for example, an insulative material, such as, for example, silicon dioxide. Substrate 12 can comprise, for example, a silicon wafer lightly doped with a p-type background dopant. Alternatively, substrate 12 can comprise an insulative material (such as, for example, silicon dioxide) or a conductive material (such as, for example, a conductive metal or a semiconductive material conductively doped with a conductivity-enhancing dopant). To aid the interpretation of the claims that follow, the term "semiconductor substrate" is defined to mean any construction comprising semiconductive material, including, but not limited to, bulk semiconductive materials such as a semiconductive wafer (either alone or in assemblies comprising other materials thereon), and semiconductive materials layers (either alone or in assemblies comprising other materials). The term "substrate" refers to any supporting structure, including, but not limited to, the semiconductor substrates described above.

An opening 16 is formed within support material 14. Opening 16 can be formed by methods known to persons of ordinary skill in the art, such as, for example, photolithographic processing.

A sacrificial mass 18 is formed within opening 16, and a metal-comprising layer 20 is formed over sacrificial mass 18. Sacrificial mass 18 can comprise either carbon or boron. Exemplary carbon materials are amorphous carbon, polymethyl methacrylate, polystyrene and nylon. Exemplary boron materials are boron, boron carbide ($B_4C$) and boron nitride. In alternative embodiments of the invention, mass 18 can consist essentially of carbon, boron, or mixtures thereof. A sacrificial mass 18 of carbon can be formed within opening 16 by, for example, plasma enhanced chemical vapor deposition. A sacrificial mass 18 of boron can be formed within opening 16 by, for example, sputter deposition using a boron-containing target source.

Metal-comprising layer 20 can comprise, for example, metals, such as titanium, tantalum, vanadium, zirconium and other refractory metals, as well as iron and chromium. Metal-comprising layer 20 can be formed by, for example, sputter deposition from an appropriate source. In the shown embodiment, metal-comprising layer 20 is confined within opening 16. Such confinement of metal-comprising layer 20 within opening 16 can be accomplished by conventional methods, such as, for example, sputter-depositing the metal-comprising layer using an appropriate sputtering target followed by chemically-mechanically polishing to produce a planarized surface as indicated by drawing in FIG. 1. In alternative embodiments, metal-comprising layer 20 can extend outside of opening 16 and over support material 14.

After formation of mass 18 and layer 20, wafer fragment 10 is exposed to hydrogen gas to convert at least a portion of sacrificial mass 18 to a volatile form. Specifically, wafer fragment 10 is placed within a reaction chamber and subjected to a temperature of above 400° C., and more preferably of from about 400° C. to about 800° C., and to a pressure of from about 0.001 atmospheres to about 10 atmospheres in the presence of an ambient comprising at least 1% hydrogen gas. Semiconductor wafer fragment 10 is exposed to such temperature and pressure conditions for a time of from about 0.01 minutes to about 100 minutes. During such exposure, the hydrogen gas permeates metal layer 20 and interacts with sacrificial mass 18 to hydrogenate at least a portion of sacrificial mass 18 and convert such portion to a volatile form. If sacrificial mass 18 comprises carbon, the carbon component of mass 18 is converted to, for example, the volatile molecule methane ($CH_4$). If sacrificial mass 18 comprises boron, the boron is converted to, for example, the volatile molecule diborane ($B_2H_6$).

The volatilized portion of mass 18 is transported to metal layer 20 by gas diffusion processes. In embodiments in which the volatilized component comprises methane, the carbon component of the methane can subsequently react with metal layer 20 to become alloyed into layer 20 as a carbide and/or as a solid solution. The reaction of the carbon in the methane with the metal-comprising layer releases hydrogen gas. Typically, the hydrogen will be recycled by reacting with remaining carbon in layer 18 to form more methane which, in turn, reacts with more metal layer 20 to form a mixture of more carbide and/or solid solution which, in turn, releases hydrogen to continue the process. The recycling can continue many times. Naturally, some hydrogen may out-diffuse through the metal 10 at any time and be replenished by hydrogen diffusing in through metal 20 from the furnace ambient.

In embodiments in which sacrificial layer 18 comprises boron, the volatilized component comprises $B_2H_6$. The boron of the $B_2H_6$ reacts with metal layer 20 to become alloyed into the metal as a metal boride and/or solid solution. The reaction releases hydrogen gas. Typically, the hydrogen will be recycled by reacting with remaining boron in layer 18 to form more diborane which, in turn, reacts with more metal layer 20 to form a mixture of more boride and/or solid solution which, in turn, releases hydrogen to continue the process. The recycling can continue many times. Naturally, some hydrogen may out-diffuse through the metal at any time and be replenished by hydrogen diffusing in through metal 20 from the furnace ambient.

Figure 2:
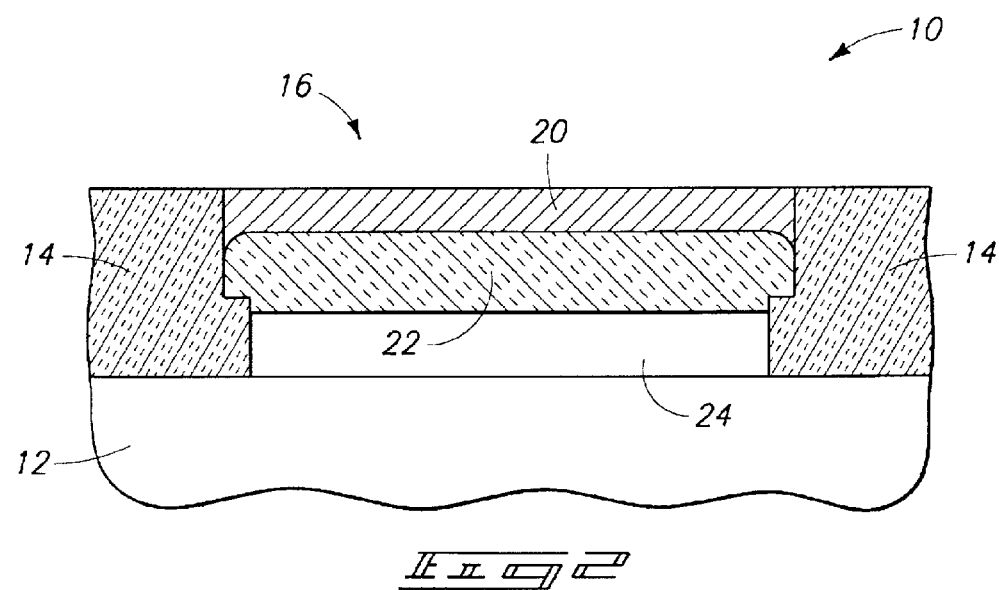
FIG. 2 is a view of the FIG. 1 wafer fragment at a stage subsequent to that of FIG. 1.

FIG. 2 illustrates wafer fragment 10 after volatilization of sacrificial mass 18 (FIG. 1). The volatilization has replaced sacrificial mass 18 with a void region 24 between metal layer 20 and substrate 12. The volatilized component from sacrificial mass 18 has interacted with metal layer 20 to form a region 22 comprising a mixture of the volatilized component and the material of metal layer 20. As discussed above, such mixture can be a metal compound (such as, for example, a carbide), a solid solution, or both. Void 24 is effectively hermetically sealed by metal-comprising layer 20. Specifically, although small gas molecules (such as $H_2$) can permeate metal-comprising layer 20, macroscopic structures and larger molecules cannot penetrate metal-comprising layer 20. Thus metal-comprising layer 20 prevents macroscopic contaminants (such as dust), and molecular impurities (such as $H_2O$, $Cl_2$ and other molecules) from entering void 24.

The mixing of the volatilized component with metal layer 20 expands a bottom region of metal layer 20 to increase a thickness of layer 20. The volume increase of layer 20 is less than the initial volume of sacrificial mass 18 (FIG. 1) that is volatilized. Accordingly, void 24 results A thickness of void 24 equals the initial thickness of layer 18 minus the increase in thickness of metal layer 20. Such thickness of void region 24 can be estimated. An exemplary application utilizes a metal layer 20 that is 10,700 angstroms thick and consists essentially of titanium, and a sacrificial mass 18 that is 6000 angstroms thick and consists essentially of amorphous carbon with a density of 2 grams per cubic centimeter. In such exemplary application, volatilization of mass 18 will expand the thickness of titanium layer 20 to about 12,200 angstroms and leave a void 24 having a thickness of about 4,500 angstroms.

As another example, metal layer 20 has a thickness of about 10,700 angstroms and consists essentially of titanium, and sacrificial mass 18 has a thickness of about 12,000 angstroms and consists essentially of one or more carbon materials having a density of roughly 1 gram per cubic centimeter (such as, for example, polymethyl methacrylate, polystyrene, or nylon). Volatilization of layer 18 increases the thickness of metal layer 20 to about 12,200 angstroms, and leaves a void region 24 having a thickness of greater than about 10,000 angstroms.

As yet another example, metal layer 20 comprises a thickness of about 10,900 angstroms of tantalum, and sacrificial mass 18 comprises a thickness of about 12,000 angstroms of a carbon compound having a density of about 1 gram per cubic centimeter. Volatilization of layer 18 increases a thickness of metal layer 20 to about 13,900 angstroms and leaves a void 24 having a thickness of about 9,000 angstroms. It is noted that utilization of tantalum in metal layer 20 can be advantageous. Specifically, the resistivity of tantalum carbide (TaC) is about 30 microohm-cm while that of titanium carbide (TiC) is from about 180 to about 250 microohm-cm. Also, it is noted that a 9,000 angstrom thick void space is approximately equivalent to a 36,000 angstrom thick silicon material in terms of dielectric properties.

In one sense, metal layer 20 can function as a sponge for absorbing a volatile component from sacrificial mass 18. Accordingly, the amount of sacrificial mass 18 that can be volatilized can be limited by an absorptive capacity of metal layer 16. Such absorptive capacity can be increased by increasing a thickness of metal layer 20, as well as by changing internal metallurgical properties of metal layer 20. For instance, metal layer 20 will typically have greater absorptive properties when the metal layer comprises small grain sizes, rather than large grain sizes.

A rate at which material from sacrificial mass 18 is incorporated into metal layer 20 can be limited in part by a rate of diffusion of material from layer 18 into metal layer 20. However, it is noted that diffusion of carbon and boron into refractory metal layers is typically quite rapid. For example, at 700° C., the diffusivity of carbon into bulk tantalum is $1.4 \times 10^{-11}$ cm$^2$ per second. Accordingly, carbon will diffuse to a depth of about 10,000 angstroms in tantalum in roughly 15 minutes at 700° C. Carbon diffuses even faster into iron (at a rate of about $6.1 \times 10^{-7}$ cm$^2$ per second in bulk iron). Accordingly, it can be advantageous to use iron as the metal layer 20 in some instances.

A rate at which material from sacrificial mass 18 is transferred to metal layer 20 can also be limited, at least in part, by a rate at which hydrogen permeates through metal layer 20 to reach sacrificial mass 18. A rate of hydrogen permeability through metal layer 20 can be increased by, for example, increasing a pressure of hydrogen against metal layer 20 during a reaction process. In the event that hydrogen permeation through metal layer 20 is impeded by formation of contaminants within metal layer 20 (such as contaminants formed from minor oxygen, nitrogen or sulphur contamination of a source hydrogen gas), temperature and/or time variations can be developed to maintain suitable hydrogen permeability within a metal layer 20.

It is noted that if layer 22 comprises a carbide, such layer may be brittle. Accordingly, it is generally preferable to utilize a metal layer 20 sufficiently thick such that only a portion of the layer is converted to a carbide. The carbide is then supported by a mechanically less brittle top metal portion of layer 20. An alternative method of increasing a strength of metal layer 20 is to form a second metal layer (not shown) over metal layer 20 to provide additional mechanical strength for supporting metal layer 20. Such second metal layer can comprise, for example, palladium, and can be formed either before or after diffusion of a component from sacrificial mass 18 into metal layer 20. Palladium has desirable characteristics of being permeable to hydrogen, non-reactive with carbon, and having a low resistivity (lower than titanium and tantalum).

Figure 3:
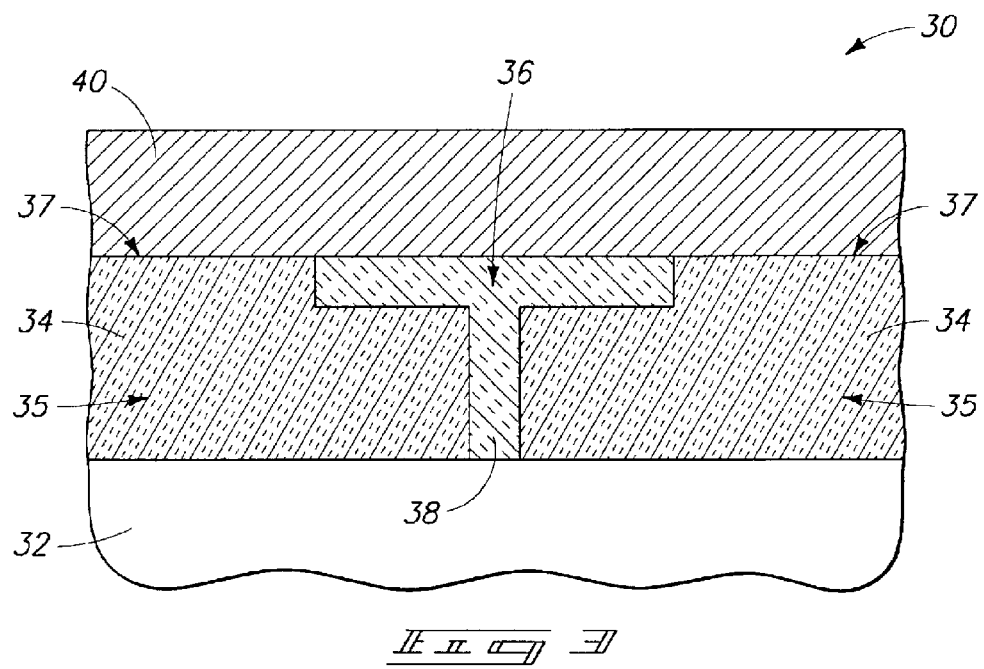
FIG. 3 is a diagrammatic, cross-sectional, fragmentary view of a semiconductor wafer fragment at a preliminary stage of a second embodiment method of the present invention.

A second embodiment of the invention is described with reference to FIGS. 3 and 4. Referring to FIG. 3, a semiconductor wafer fragment 30 comprises a substrate 32 and a support material 34 formed over substrate 32. Substrate 32 and support material 34 can comprise identical materials as those discussed above regarding substrate 12 and support material 14, respectively, of FIG. 1. An opening 36 extends within support material 34 and is filled with a sacrificial mass 38. Although in the shown embodiment opening 36 is entirely filled sacrificial mass 38, the invention encompasses other embodiments wherein opening 36 is only partially filled with sacrificial mass 38. Opening 36 can be formed by methods known to persons of ordinary skill in the art. Such methods can include, for example, photolithography. Sacrificial mass 38 can comprise identical materials to those of sacrificial mass 18 of FIG. 1. Sacrificial mass 38 forms a column over substrate 32, and comprises a different aspect ratio at a lower end of the column than at an upper end of the column. In the shown embodiment, the lower portion of sacrificial mass 38 comprises a narrower lateral width than does the upper portion.

A metal-comprising layer 40 is formed over support 34 and sacrificial mass 38. Metal-comprising layer 40 can comprise identical components to those discussed above regarding metal-comprising layer 20 of FIG. 1.

Figure 4:
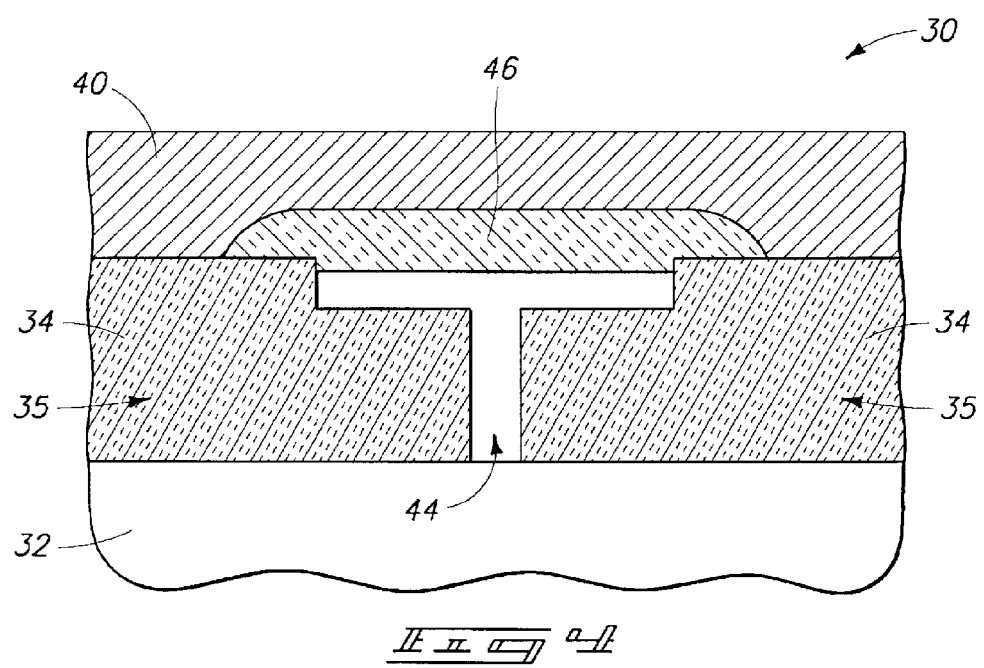
FIG. 4 is a view of the FIG. 3 wafer fragment at a stage subsequent to that of FIG. 3.

Referring to FIG. 4, wafer fragment 30 is exposed to conditions which hydrogenate the material of sacrificial mass 38 (FIG. 3) and transport such material to metal-comprising layer 40. The transport of material from sacrificial mass 38 leaves a void 44 between metal layer 40 and substrate 32. In the shown embodiment, substantially all of sacrificial mass 38 has been volatilized and transported to metal-comprising layer 40. However, it is to be understood that the invention encompasses other embodiments (not shown) wherein only a portion of sacrificial mass 38 is volatilized and transported.

The transported material of sacrificial mass 38 combines chemically with part of metal layer 40 to form a region 46 comprising, for example, metal carbide, a solid solution, or a mixture of both. The conditions for volatilizing and transporting components of sacrificial mass 38 can be similar to those discussed above for volatilizing and transporting components of sacrificial mass 18 (FIG. 1). Specifically, such conditions can comprise hydrogenating a component of sacrificial mass 38.

An alternative description of the embodiment of FIG. 3 is that opening 36 is a well extending within support material 34, and sacrificial mass 38 is formed within such well. It is noted that in the context of this document, the term "well" can refer to an opening extending through a support structure (as shown), or can refer to a cavity extending only partially into a substrate (not shown), or a combination of an opening extending through a support structure and a cavity extending only partially into a substrate. Support structure 34 defines sidewalls 35 of well 36. Sidewalls 35 have outermost surfaces 37, and metal-comprising layer 40 is formed over such outermost surfaces. Sidewalls 35 can comprise insulative material, such as, for example, silicon dioxide, or can comprise a conductive material, such as, for example, aluminum. Preferably, sidewalls 35 comprise a material that does not react with a volatilized component of sacrificial mass 38 under the volatilization conditions. For instance, if sacrificial mass 38 comprises carbon, and the volatilized component is in the form of methane, sidewalls 35 can comprise one or more of Cu, Ag, or Au, and metal-comprising layer 40 can comprise one or more of Ti, Ta, Zr, V, Nb, W and similar metals. The carbon can then be volatilized at a temperature of less than about 800° C. Under such temperature conditions the volatilized carbon will react with layer 40 and not with sidewalls 35.

Figure 5:
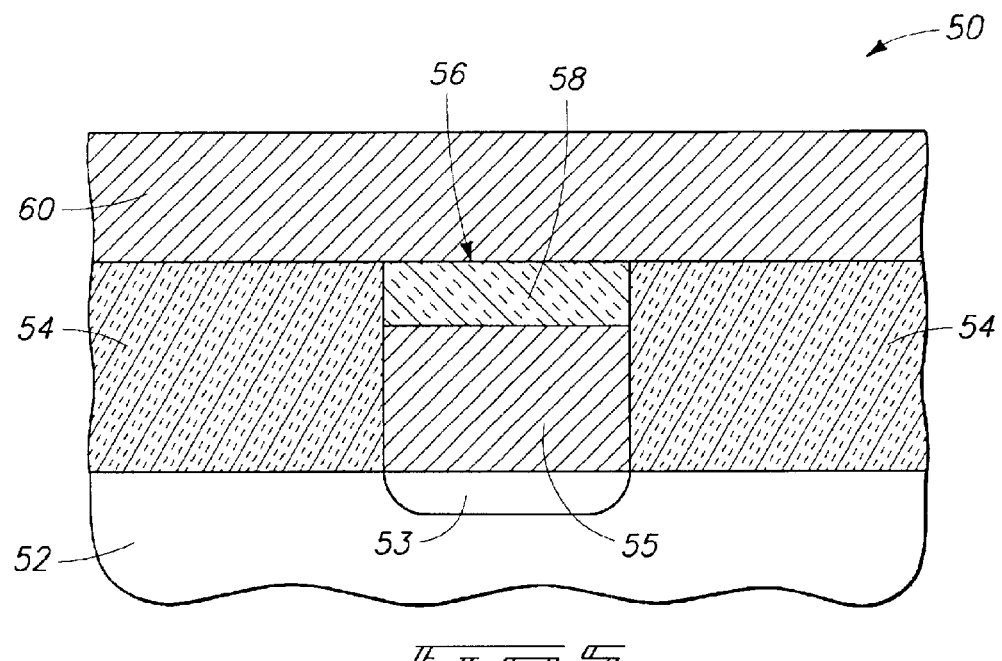
FIG. 5 is a diagrammatic, cross-sectional, fragmentary view of a semiconductor wafer fragment at a preliminary stage of a third embodiment method of the present invention.

Another embodiment of the invention is described with reference to FIGS. 5 and 6. Referring to FIG. 5, a semiconductor wafer fragment 50 is illustrated. Wafer fragment 50 comprises a substrate 52 and a support material 54 formed over substrate 52. Substrate 52 and support material 54 can comprise identical materials to those discussed above for substrate 12 and support material 14 of the FIG. 1 construction. In the shown embodiment, substrate 52 comprises a semiconductive material having a diffusion region 53 formed therein. Diffusion region 53 is a region conductively doped with a conductivity-enhancing dopant. An opening 56 extends through support material 54 and to diffusion region 53. A first metal layer 55 is formed at a lower portion of opening 56, and a sacrificial mass 58 is formed over first metal layer 55. First metal layer 55 can be formed by conventional methods, such as, for example, chemical vapor deposition. Sacrificial mass 58 can be formed by identical methods as those discussed above regarding formation of sacrificial mass 18 of the FIG. 1 construction. A second metal layer 60 is formed over sacrificial mass 58. Second metal layer 60 can comprise identical materials to those discussed above regarding metal layer 20 of the FIG. 1 construction.

Figure 6:
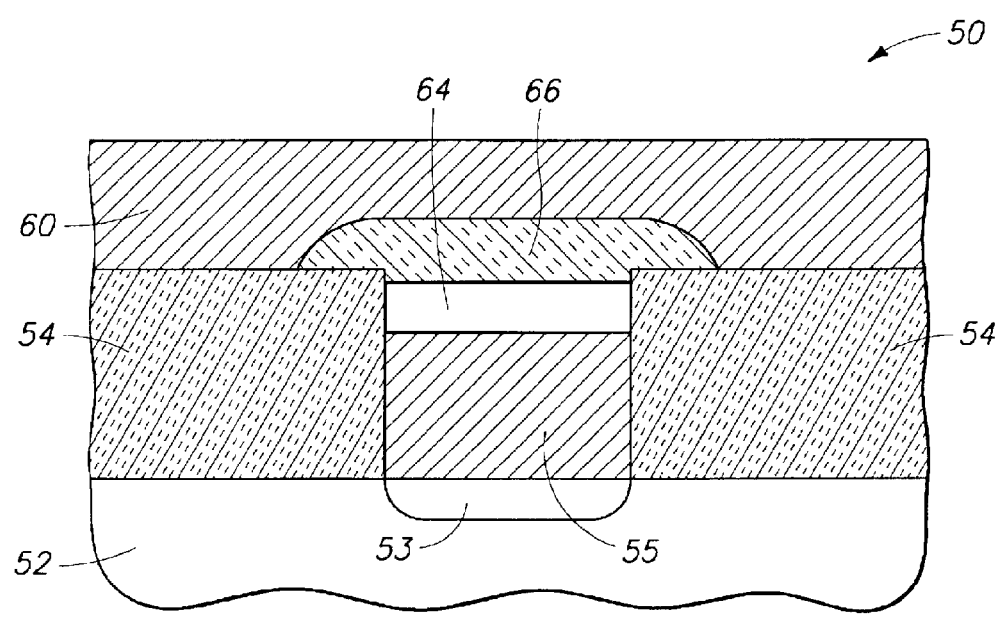
FIG. 6 is a view of the FIG. 5 wafer fragment at a stage subsequent to that of FIG. 5.

Referring to FIG. 6, wafer fragment 50 is subjected to conditions which volatilize at least a portion of sacrificial mass 58 (FIG. 5) and transport such portion to metal layer 60. Such volatilization conditions can comprise hydrogenating a component of sacrificial mass 58 in accordance with procedures discussed above regarding the embodiment of FIGS. 1 and 2.

The transfer of material from sacrificial mass 58 to metal 60 forms a region 66 of material from mass 58 within metal 60, and leaves a void 64. Region 66 can comprise either a solid solution, or a reaction product, similar to the solid solutions and reaction products discussed above regarding region 22 of FIG. 2.

The construction of FIG. 6 comprises a capacitor wherein first metal layer 55 is a first capacitor electrode, second metal layer 60 is a second capacitor electrode, and void 64 is a dielectric layer between the capacitor electrodes. In the shown embodiment, void 64 is the only dielectric between electrodes 55 and 60. However, it is to be understood that the invention encompasses other embodiments (not shown) wherein additional dielectric materials are provided between electrodes 55 and 60. For instance, one or both of silicon nitride or silicon dioxide can be provided over electrode 55 prior to provision of sacrificial mass 58. The dielectric formed between electrodes 55 and 66 would then comprise the silicon dioxide and/or silicon nitride, in addition to the void space 64. Also, it is noted that insulative spacers can be provided over electrode 55 and extending through sacrificial layer 58 to metal layer 60. Such spacers can then support metal layer 60 over metal layer 55 after formation of void 64. Additionally, it is noted that although the shown embodiment illustrates an entirety of a volatilized component being transported to upper electrode 60, the invention encompasses other embodiments (not shown) wherein at least some of the volatilized component is transported to lower electrode 55.

Figure 7:
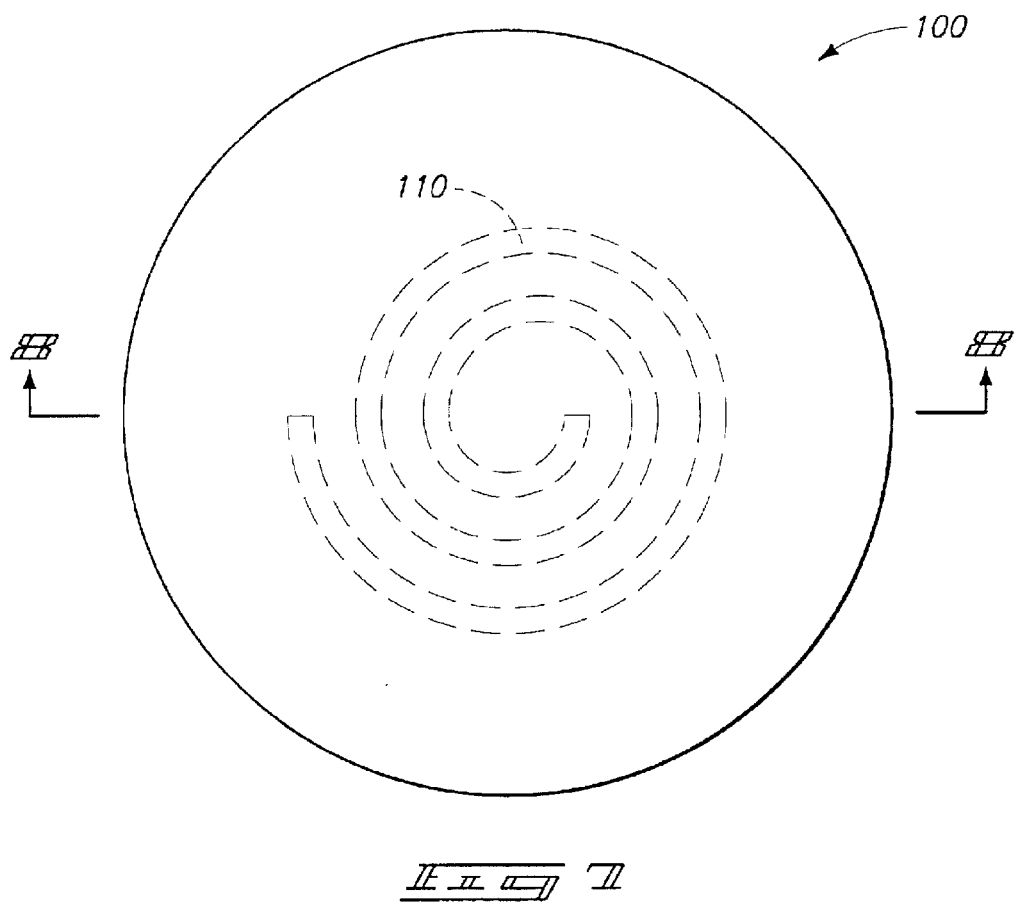
FIG. 7 is a top view of a semiconductor wafer processed according to a fourth embodiment method of the present invention.
Figure 8:
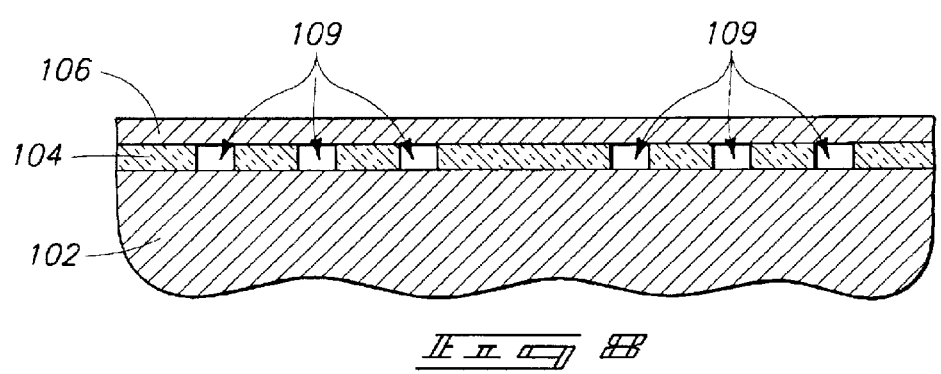
FIG. 8 is a fragmentary, diagrammatic, cross-sectional sideview of the FIG. 7 semiconductor wafer along the line 8—8.

Another embodiment of the invention is described with reference to FIGS. 7 and 8. FIGS. 7 and 8 illustrate a top view and a cross-sectional side view, respectively, of a semiconductive wafer 100. As shown in the cross-sectional side view of FIG. 8, wafer 100 comprises a substrate 102, a sacrificial mass 104, and a metal layer 106 formed over sacrificial mass 104.

Referring to FIG. 7, a pattern 110 is shown in dashed line on a surface of wafer 100. In the shown embodiment, pattern 110 comprises a spiral. It is to be understood, however, that pattern 110 can comprise other shapes (not shown). Semiconductive wafer 100 is processed by exposing the wafer to a hydrogen atmosphere and selectively heating the portion of wafer within pattern 110 while not heating other portions of the wafer. Such selective heating can be accomplished by, for example, directing a laser or focused light source toward the region of pattern 110, or, as another example, using a heated metal contact. The heating of the pattern of region 110 causes sacrificial mass 104 (FIG. 8) to be volatilized from between substrate 102 and metal layer 106 within the region 110 to form voids 109 (FIG. 8). However, as other regions of wafer 100 are not heated, the sacrificial mass 104 is not volatilized within such other regions. A method of the present invention thus enables selected portions of a volume of sacrificial mass 104 to be volatilized to form precise structures within sacrificial mass 104. Such precise structures can be utilized in, for example, microelectromechanical devices. An exemplary device is a chromatographic column. Specifically, a method of the present invention can enable a long spiraling conduit to be formed within sacrificial mass 104, and between substrate 102 and layer 106. Such conduit can subsequently be used as a column for gas chromatography utilizing conventional methods, after forming ports at the ends of the column for fluid flow.

Another use for the selective patterning described with reference to FIG. 7 and 8 is during fabrication of integrated circuitry. For instance, the selective patterning can be utilized to form different thickness void regions over different regions of a semiconductive wafer. Accordingly, if, for example, a plurality of capacitors is formed across the surface of the wafer, different portions of the wafer can be subjected to different processing conditions (such as different temperatures, or different times of exposures to temperatures) such that voids utilized as dielectrics within different capacitors will have different thicknesses. The different capacitors will then have different capacitances.

It is noted that in the embodiment shown in FIGS. 7 and 8, a semiconductor wafer assembly is processed. However, it is to be understood that the invention encompasses other embodiments (not shown) wherein a sacrificial mass of the present invention is sandwiched between nonsemiconductive components and selectively processed to form microelectronic machinery. For instance, the substrate 102 described above with reference to FIGS. 7 and 8 as a semiconductive wafer fragment could, in such other embodiments of the invention, comprise a metal-comprising material.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a void region associated with a substrate, comprising:

providing a substrate;

forming a sacrificial mass over the substrate;

forming a metal-comprising layer over the mass; and subjecting the mass to conditions wherein a component of the mass transports from the mass into the metal comprising layer to form a mixture of the metal comprising layer and the component, and wherein transporting the component leaves a hermetically-sealed void region between the substrate and the mixture of the metal comprising layer and the component.

2. The method of claim 1 wherein the layer comprises silicon nitride.

3. A method of forming a void region associated with a substrate, comprising:

providing a substrate;

forming a sacrificial mass over the substrate;

forming a metal-comprising layer over the mass; and subjecting the mass to conditions which transport a component of the mass to the metal-comprising layer, the transported component being alloyed into the metal-comprising layer and leaving a hermetically-sealed void region between the metal-comprising layer and the substrate.

4. The method of claim 3 wherein less than all of the sacrificial mass is transported to the metal-comprising layer.

5. The method of claim 3 wherein substantially all of the sacrificial mass is transported the metal-comprising layer.

6. The method of claim 3 wherein the metal-comprising layer comprises one or more of vanadium, zirconium, titanium, tantalum and iron.

7. The method of claim 3 wherein the metal-comprising layer comprises one or more of titanium or tantalum, wherein the component is carbon, and wherein the component is alloyed as one or both of a metal-carbide and a solid solution.

8. The method of claim 1 wherein the metal comprising layer is configured to absorb the component of the sacrificial mass.

9. The method of claim 1 wherein an amount of sacrificial mass is transported to function of absorptive capacity of the layer.

10. The method of claim 1 wherein the metal-comprising layer comprises one or more of vanadium, zirconium, titanium, tantalum, iron.

11. The method of claim 1 wherein rate of transport of the mass into the layer is a function of rate of diffusion of the component from the mass into the layer.

12. The method of claim 1 wherein rate of transport of the mass into the layer is a function of rate of hydrogen permeation through the layer to reach the mass.

* * * * *

UNITED STATES PATENT AND TRADEMARK OFFICE
CERTIFICATE OF CORRECTION

PATENT NO. : 6,794,261 B2  Page 1 of 1
DATED : September 21, 2001
INVENTOR(S) : Eldridge It is certified that error appears in the above-identified patent and that said Letters Patent is hereby corrected as shown below:

Column 1,
Line 9, please delete "pant" before "application" and insert -- patent --.

Column 4,
Line 25, please insert -- 10 -- after "metal".
Line 49, please delete "results A" after "void 24" and insert -- results. A --.

Column 6,
Line 12, please insert -- with -- after "filled".

Column 10,
Line 2, please insert -- to -- after "transported".
Line 16, please delete "is transported to" after "mass" and insert -- that is transported is a --.

Signed and Sealed this

Twenty-fifth Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,794,261 B2
DATED : September 21, 2004
INVENTOR(S) : Eldridge

It is certified that error appears in the above-identified patent and that said Letters Patent is hereby corrected as shown below:

Column 1,
Line 9, please delete "pant" before "application" and insert -- patent --.

Column 4,
Line 25, please insert -- 10 -- after "metal".
Line 49, please delete "results A" after "void 24" and insert -- results. A --.

Column 6,
Line 12, please insert -- with -- after "filled".

Column 10,
Line 2, please insert -- to -- after "transported".
Line 16, please delete "is transported to" after "mass" and insert -- that is transported is a --.

This certificate supersedes Certificate of Correction issued October 25, 2005.

Signed and Sealed this

Thirteenth Day of June, 2006

JON W. DUDAS
*Director of the United States Patent and Trademark Office*